US008968513B2

(12) United States Patent
Hayashi

(10) Patent No.: US 8,968,513 B2
(45) Date of Patent: Mar. 3, 2015

(54) PLASMA PROCESSING APPARATUS

(75) Inventor: Daisuke Hayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1024 days.

(21) Appl. No.: 13/046,925

(22) Filed: Mar. 14, 2011

(65) Prior Publication Data

US 2011/0226421 A1 Sep. 22, 2011

Related U.S. Application Data

(60) Provisional application No. 61/325,574, filed on Apr. 19, 2010.

(30) Foreign Application Priority Data

Mar. 16, 2010 (JP) .................................. 2010-059486

(51) Int. Cl.
| C23C 16/00 | (2006.01) |
| C23F 1/00 | (2006.01) |
| H01L 21/306 | (2006.01) |
| H01J 7/24 | (2006.01) |
| H05B 31/26 | (2006.01) |
| H01J 37/32 | (2006.01) |

(52) U.S. Cl.
CPC ..... *H01J 37/32541* (2013.01); *H01J 37/32091* (2013.01); *H01J 37/3255* (2013.01); *H01J 37/32568* (2013.01)
USPC ............ 156/345.44; 156/345.43; 156/345.47; 118/723 E; 118/723 ER; 315/111.21

(58) Field of Classification Search
USPC ...... 156/345.43–345.47; 118/723 E, 723 ER; 315/111.21
See application file for complete search history.

(56) References Cited

U.S. PATENT DOCUMENTS

| 7,112,926 | B2 * | 9/2006 | Himori et al. ............ 315/111.21 |
| 7,153,387 | B1 * | 12/2006 | Tomoyasu ............... 156/345.47 |
| 2002/0170676 | A1 * | 11/2002 | Mitrovic et al. ......... 156/345.47 |
| 2005/0276928 | A1 * | 12/2005 | Okumura et al. ............. 427/446 |
| 2007/0144671 | A1 * | 6/2007 | Ohmi et al. ............... 156/345.34 |
| 2009/0101284 | A1 * | 4/2009 | Higuma et al. .......... 156/345.51 |
| 2009/0242134 | A1 * | 10/2009 | Iwata ....................... 156/345.48 |
| 2009/0242135 | A1 * | 10/2009 | Koshimizu et al. ...... 156/345.48 |

FOREIGN PATENT DOCUMENTS

| JP | 07-191764 A | 7/1995 |
| JP | 11-204296 A | 7/1999 |

(Continued)

*Primary Examiner* — Rakesh Dhingra
(74) *Attorney, Agent, or Firm* — Pearne & Gordon LLP

(57) ABSTRACT

An intensity distribution of an electric field of a high frequency power used for generating plasma is controlled by using an electrode made of a homogeneous material and a moving body. There is provided a plasma processing apparatus for introducing a processing gas into an evacuable processing chamber 100 and generating plasma by a high frequency power and performing a plasma process on a wafer W by the plasma. The plasma processing apparatus includes a dielectric base 105a having a multiple number of fine holes A; a varying member 200 as the moving body provided with a multiple number of rod-shaped members B capable of being inserted into and separated from the fine holes A; and a driving mechanism 215 configured to drive the varying member 200 to allow the rod-shaped members B to be inserted into and separated from the fine holes A.

16 Claims, 10 Drawing Sheets

(56) References Cited

FOREIGN PATENT DOCUMENTS

| JP | 2000-323456 A | | 11/2000 | |
| JP | 2005-228973 A | | 8/2005 | |
| JP | 2008-243973 | * | 10/2008 | .............. C23C 16/00 |
| JP | 2008-258374 A | | 10/2008 | |

* cited by examiner

FIG. 8
<DRIVING OF MULTI-PARTS>
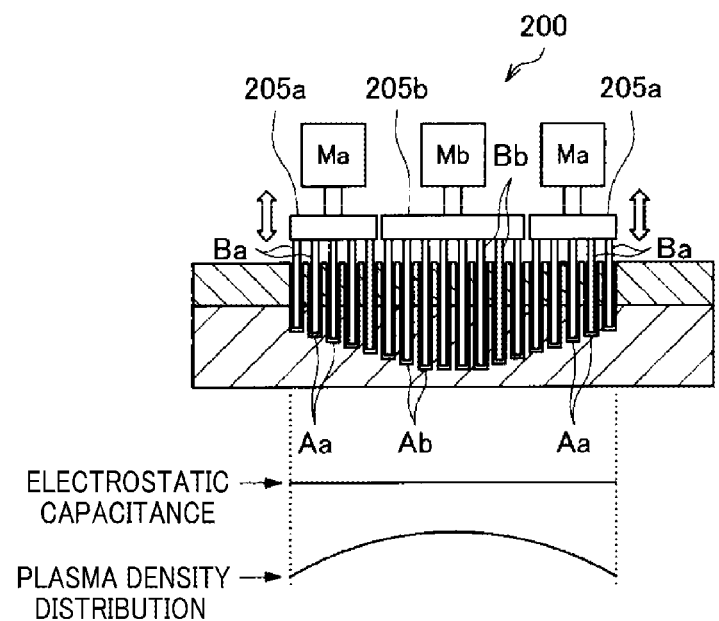
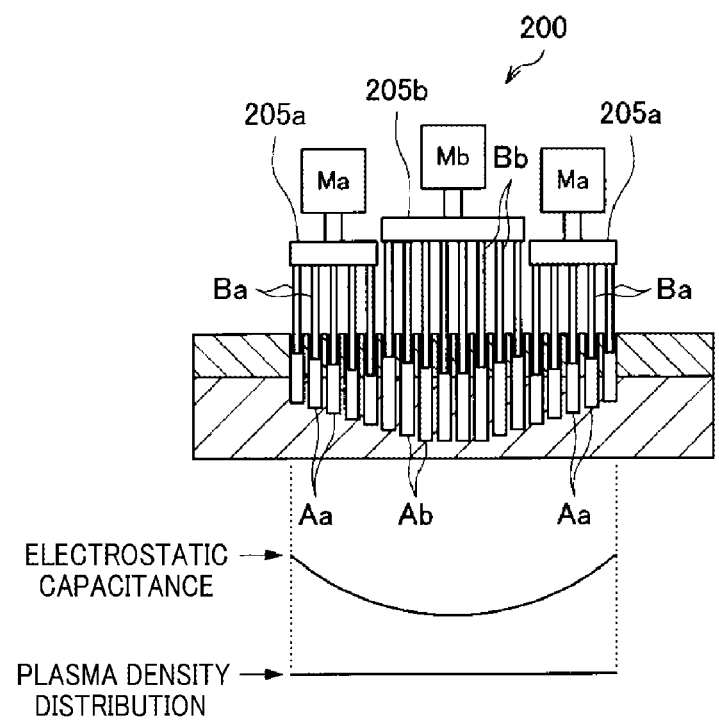

PLASMA PROCESSING APPARATUS

CROSS-REFERENCE TO RELATED APPLICATION

This application claims the benefit of Japanese Patent Application No. 2010-059486 filed on Mar. 16, 2010 and U.S. Provisional Application Ser. No. 61/325,574 filed on Apr. 19, 2010, the entire disclosures of which are incorporated herein by reference.

FIELD OF THE INVENTION

The present disclosure relates to a plasma processing apparatus capable of controlling a distribution of electric field intensity of a high frequency power by using an electrode for use in the plasma processing apparatus and a moving body.

BACKGROUND OF THE INVENTION

Recently, as miniaturization is increasingly demanded, a relatively high frequency power needs to be supplied to generate high density plasma. As depicted in FIG. 10, as a frequency of a power supplied from a high frequency power supply 150 becomes higher, a high frequency current flows along a surface of a lower electrode 110 and particularly, along a top surface of the lower electrode 110 from an edge area of the lower electrode 110 toward a central area thereof by a skin effect. Accordingly, electric field intensity at the central area of the lower electrode 110 becomes higher than electric field intensity at the edge area of the lower electrode 110, so that ionization or dissociation of a gas is accelerated at the central area of the lower electrode 110 as compared to the edge area thereof. Consequently, electron density of plasma at the central area of the lower electrode 110 becomes higher than electron density of plasma at the edge area thereof. At the central area of the lower electrode 110 where the electron density of plasma is high, resistivity of plasma becomes low, and, thus, the high frequency current is concentrated at a central area of an upper electrode 105 facing the lower electrode 110 and plasma density becomes more non-uniform.

In order to improve uniformity in plasma, it has been suggested to embed a rectangular-shaped flat dielectric member in a lower center of a conductor of an electrode (for example, see Patent Document 1). According to this suggestion, an electric field intensity is decreased under the dielectric member by the function of the dielectric member.

In order to further improve uniformity in plasma, it has been suggested to form a dielectric member embedded in a conductor of an electrode into a taper shape (for example, see Patent Document 2). In Patent Document 2, since the dielectric member is formed into a taper shape, an intensity distribution of an electric field at an edge area of the dielectric member is not too much decreased as compared to a case in which the dielectric member is flat. Accordingly, uniformity in a distribution of electric field intensity can be further improved.

Patent Document 1: Japanese Patent Laid-open Publication No. 2000-323456
Patent Document 2: Japanese Patent Laid-open Publication No. 2005-228973

However, in order to embed the dielectric member in the conductor, a method of connecting different kinds of materials is needed. Particularly, in order to embed the taper-shaped dielectric member in the conductor, a large-scale taper structure needs to be manufactured. By way of example, the conductor and the dielectric member may be connected to each other by an adhesive or a screw. Further, the conductor may be made of metal such as aluminum or the like and the dielectric member may be made of ceramic or the like, and, thus, a linear thermal expansion coefficient is different. Therefore, an appropriate gap may need to be formed at a connecting area between the conductor and the dielectric member. However, if the dielectric member is formed into a taper shape, it is difficult to perform a machining process thereto and a dimensional accuracy at a tapered area becomes deteriorated. Accordingly, a stress may be concentrated on a part of the connecting area due to a difference in a linear thermal expansion coefficient, and, thus, the adhesive on a connecting surface may be peeled off and may become a contaminant within a chamber.

If an attempt to change a profile for an effect of a plasma process is made, since the dielectric member is embedded in the conductor, a broad scale design needs to be changed. Even if the effect of the plasma process is slightly changed by making a partial change of the design, a manufacturing process is still difficult. Therefore, in order to overcome the above-described problems, it is necessary to manufacture an electrode capable of controlling an intensity distribution of an electric field by using a single material or a material to be integrated.

If the electric field intensity can be controlled by using the electrode made of the single material as described above without performing any machining process thereto, it may be possible to generate plasma more uniformly according to the distribution of electric field intensity which is variable depending on a process condition such as a kind of gas or a pressure.

In order to solve the above-described problems, the present disclosure provides a novel and improved plasma processing apparatus capable of variably controlling a distribution of electric field intensity of a high frequency power by using an electrode made of a homogeneous material and a moving body.

BRIEF SUMMARY OF THE INVENTION

In accordance with one aspect of the present disclosure, there is provided a plasma processing apparatus for introducing a processing gas into an evacuable processing chamber and generating plasma by a high frequency power and performing a plasma process on a processing target object by the plasma. The plasma processing apparatus includes a dielectric base having a multiple number of recesses; a moving body provided with a multiple number of protruding members capable of being inserted into and separated from the multiple number of recesses; and a driving mechanism configured to drive the moving body to allow the multiple number of protruding members to be inserted into and separated from the multiple number of recesses.

According to this structure, since a vacuum space is regarded as a dielectric layer having a dielectric constant $\in_0$ of about "1", there is made a difference between a dielectric constant $\in_1$ of the base and the dielectric constant $\in_0$ of the vacuum space within the recess. Here, the dielectric constant $\in_0$ of the vacuum space is about "1", i.e., a lowest value among dielectric constants of dielectric materials. Therefore, the dielectric constant $\in_0$ within the recess is surely lower than the dielectric constant $\in_1$ of the base. Accordingly, a capacitance (electrostatic capacitance) within the recess is surely lower than a capacitance of the base. In terms of an electrostatic capacitance, by way of example, an area where the fine holes A as recesses are formed as depicted in an upper part of FIG. 4A has an effect equal to a case in which a dielectric member serving as the base becomes thick as depicted as a protruding area 105a1 in a lower part of FIG. 4A.

Based on this principle, in the present disclosure, by forming the multiple number of recesses in the base serving as the electrode, an electrostatic capacitance of the multiple number of recesses of the base becomes lower than an electrostatic capacitance of other areas of the base. Accordingly, it is possible to achieve an effect equal to a case in which the base becomes thicker at an area of the multiple number of recesses of the base than at other areas of the base. That is, it becomes more difficult for a high frequency power to escape from the recesses of the base than from other areas thereof. Consequently, in accordance with the present disclosure, by forming the multiple number of recesses at a central area of the base, plasma density at the central area of the base can be reduced, so that an intensity distribution of an electric field of a high frequency power used for generating plasma can be uniform (hereinafter, referred to as uniformization effect due to an upper electrode).

Further, the present disclosure has the moving body including the multiple number of protruding members configured to be inserted/separated to/from the multiple number of recesses and the driving mechanism configured to drive the moving body to allow the multiple number of protruding members to be inserted/separated to/from the multiple number of recesses. In accordance with the present disclosure, if the protruding members are made of a dielectric material, a dielectric constant of the protruding members is surely higher than the dielectric constant ($\in_0$) of the vacuum space. Accordingly, in terms of an electrostatic capacitance, when the protruding members are inserted into the recesses, a thickness of the dielectric member serving as the base as depicted as the protruding area 105a1 in the lower part of FIG. 4A becomes thin as compared to a case in which the protruding members are separated from the recesses. This means that by inserting/separating the multiple number of protruding members to/from the multiple number of recesses, it is possible to variably control impedance which indicates whether or not it is easy for a high frequency power to escape from the recess without performing a machining process on the electrode. Consequently, in accordance with the present disclosure, by adjusting the dielectric constant of the protruding members or a degree of the insertion of the protruding members into the recesses, plasma can be generated more uniformly according to the distribution of electric field intensity which is variable depending on a process condition.

In accordance with the present disclosure, there is no need to connect the base with the dielectric member, and, thus, a certain material or a certain adhesive is not needed. Besides, with respect to a plate-shaped member, the fine holes are formed at an area thereof where the uniformization effect due to an upper electrode is required, and, thus, it becomes easy and simple to manufacture the plate-shaped member.

The plurality of recesses may be fine holes or grooves.

The plurality of protruding members may be rod-shaped members capable of being inserted into and separated from the fine holes or plate-shaped members capable of being inserted into and separated from the grooves.

The plurality of protruding members may be made of a dielectric material or a metal.

If the plurality of protruding members are made of the dielectric material, a dielectric constant of the base may be higher than a dielectric constant of the dielectric material of the protruding members.

The moving body may be configured as multi-parts by dividing the multiple number of protruding members into at least two parts of an inside one and an outside one to correspond to the multiple number of recesses provided from the inner area of the base to the outer area thereof.

Among the plurality of protruding members, the protruding members configured to be inserted into and separated from the recesses formed at an outer side of the base may be made of at least one of a metal and a dielectric material having a dielectric constant higher than a dielectric constant of the protruding members configured to be inserted into and separated from the recesses formed at the inner side of the base.

The plurality of recesses may communicate with the processing chamber, and the inside of each recess may be turned into a vacuum state if the inside of the processing chamber is turned into a vacuum state.

The plurality of recesses may be formed to have different depths such that the plurality of recesses do not penetrate the base from the top to the bottom on the side of a plasma generation space, and the plurality of protruding members may be formed to have lengths corresponding to the depths of the recesses, respectively.

Depths of the recesses formed at an outer side of the base may be shallower than depths of the recesses formed at an inner side of the base, and the lengths of the protruding members formed at the outer side of the base may be shorter than the lengths of the protruding members formed at the inner side of the base according to the depths of the plurality of recesses.

The plurality of recesses may be formed in a taper shape when viewed as a whole.

The fine holes may be formed to have various diameters within a range of twice the thickness of the sheath.

A diameter of the fine hole formed at an outer side of the base may be smaller than a diameter of the fine hole formed at an inner side of the base, and diameters of the rod-shaped members formed at the outer side of the base may be smaller than diameters of the rod-shaped members formed at the inner side of the base according to the diameters of the fine holes.

In accordance with another aspect of the present disclosure, there is provided a plasma processing apparatus including a processing chamber for performing therein a plasma process on a processing target object; first and second electrodes arranged to face each other in the processing chamber and configured to form a processing space therebetween; a high frequency power supply connected with at least one of the first and second electrodes and configured to output a high frequency power into the processing chamber; a dielectric base provided to the first electrode and having a plurality of recesses; a moving body including a plurality of protruding members capable of being inserted into and separated from the plurality of recesses; and a driving mechanism configured to drive the moving body to allow the plurality of protruding members to be inserted into and separated from the plurality of recesses.

The first electrode may be an upper electrode, and the upper electrode may be provided with a multiple number of gas inlet lines and serve as a shower head.

the second electrode may be a lower electrode, and the high frequency power supply may supply a high frequency power to the lower electrode.

As described above, in accordance with the present disclosure, it is possible to variably control an intensity distribution of a high frequency electric field used for generating plasma by using an electrode made of a homogeneous material and a moving body.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 8 shows a case in which the varying mechanism is configured as multi-parts;

DETAILED DESCRIPTION OF THE INVENTION

Figure 1:
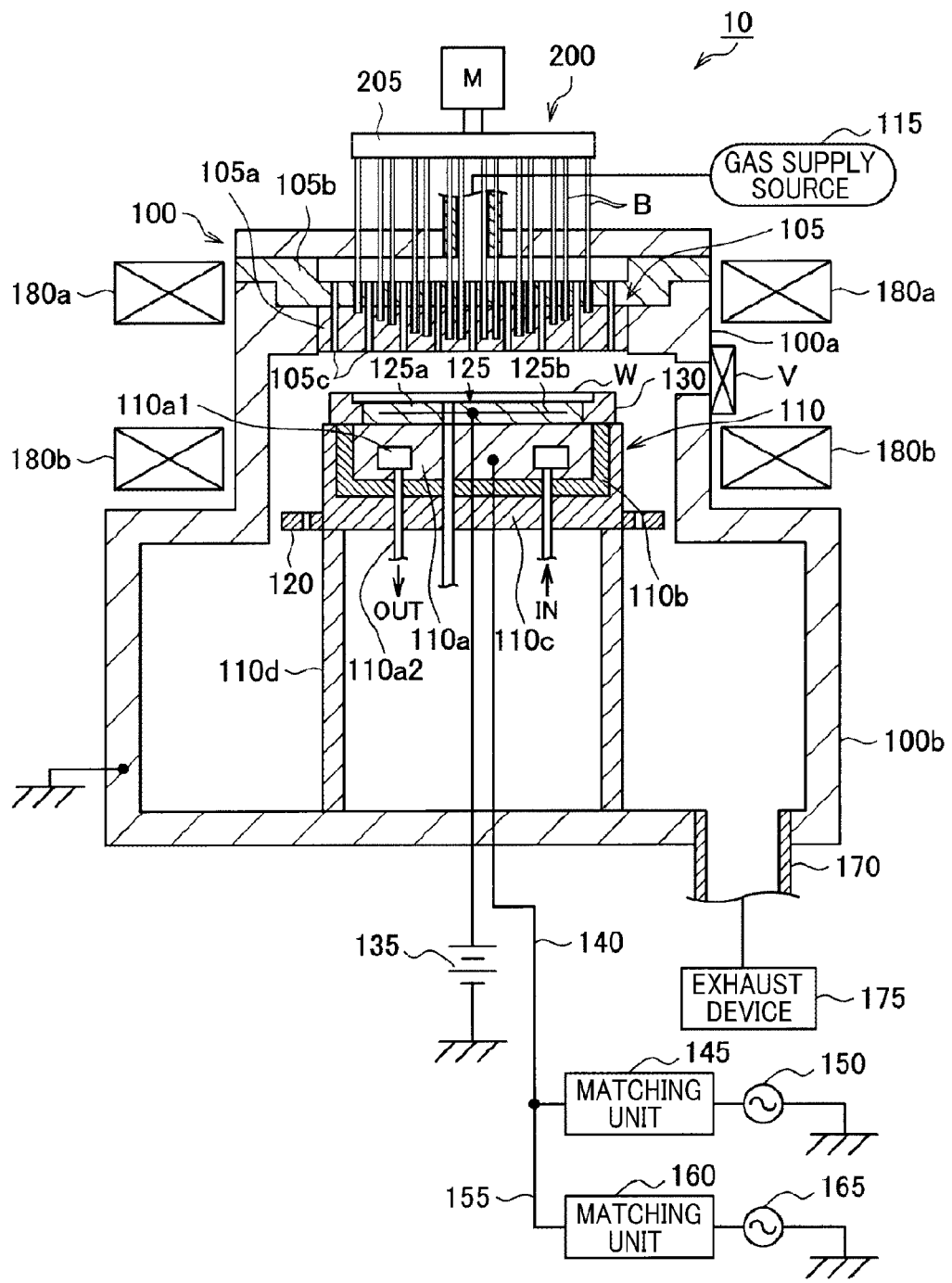
FIG. 1 is a longitudinal cross sectional view of a RIE plasma etching apparatus in accordance with an embodiment of the present disclosure.

Hereinafter, embodiments of the present disclosure will be described in detail with reference to the accompanying drawings. Through the present specification and drawings, parts having substantially same function and configuration will be assigned same reference numerals, and redundant description will be omitted.

An RIE plasma etching apparatus (parallel plate type plasma processing apparatus) using an electrode in accordance with an embodiment of the present disclosure will be explained with reference to FIG. 1. An RIE plasma etching apparatus 10 is an example of a plasma processing apparatus that generates plasma in a processing chamber and performs a plasma process on a processing target object by the plasma.

The RIE plasma etching apparatus 10 may include a depressurizable processing chamber 100. The processing chamber 100 may include an upper chamber 100a of a small diameter and a lower chamber 100b of a large diameter. The processing chamber 100 may be made of metal such as aluminum and be grounded.

Within the processing chamber 100, an upper electrode 105 and a lower electrode 110 may be positioned to face each other, so that a pair of parallel plate type electrodes may be provided. A wafer W may be loaded into the processing chamber 100 through a gate valve V and mounted on the lower electrode 110. A processing gas is introduced into the processing chamber 100 and plasma is generated by a high frequency power. The wafer W on the lower electrode 110 is etched by the plasma.

The upper electrode 105 may include an upper base 105a and a base plate 105b on the upper base 105a. The upper base 105a may be made of quartz. The upper base 105a may be made of, but not limited to, quartz ($SiO_2$), a dielectric material such as alumina ($Al_2O_3$), silicon nitride ($Si_3N_4$), aluminum nitride (AlN), yttria ($Y_2O_3$) or Teflon(registered trademark: polytetrafluoroethylene).

The processing gas may be supplied from a gas supply source 115 and diffused in a diffusion space formed by the base plate 105b made of a conductive material and the processing chamber 100. Then, as depicted in a longitudinal cross sectional view of the upper electrode 105 in FIG. 2B, the gas is introduced into the processing chamber 100 through a multiple number of gas openings 105c via a multiple number of gas inlet lines 105e provided in the upper base 105a and a multiple number of gas passages 105d. The upper electrode 105 may serve as a shower head including the upper base 105a and the base plate 105b as one body. Alternatively, the upper electrode 105 may not include the base plate 105b, and instead, the upper base 105a may be directly connected to a ceiling plate of the processing chamber 100.

A multiple number of fine holes A may be formed at an upper central area of the upper base 105a. The fine holes A formed at the central area of the upper base 105a may have the same depth. Further, the fine holes A formed at a periphery of the upper substrate 105a may have a depth shallower than that of the fine holes A formed at the central area of the upper base 105a. Thus, the multiple number of fine holes A may be formed to have a taper shape, when viewed as a whole.

Figure 2B:
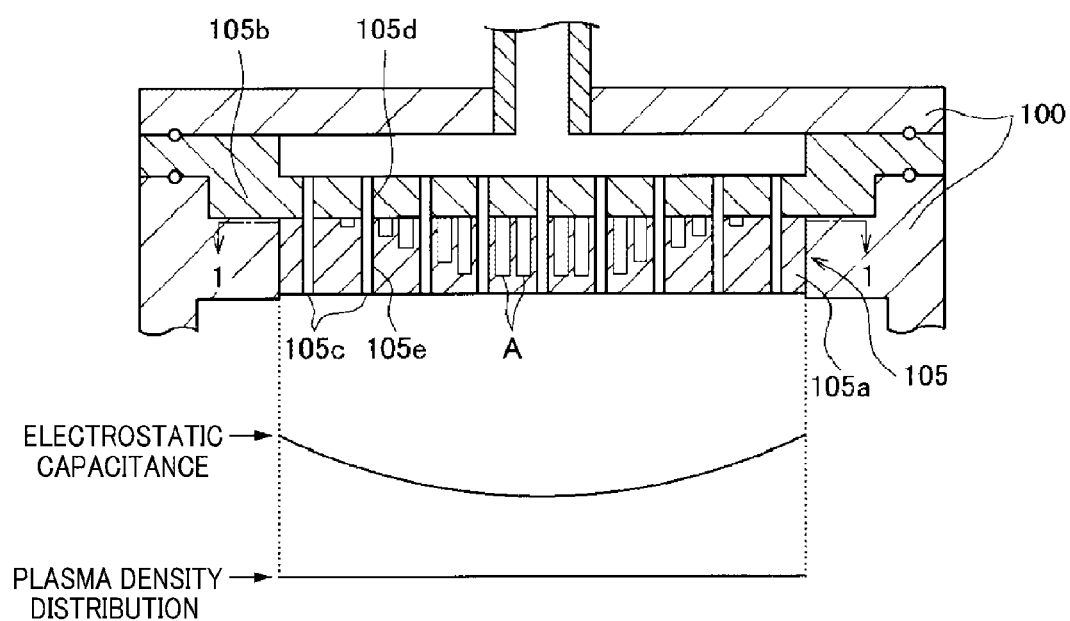
Figure 3A:
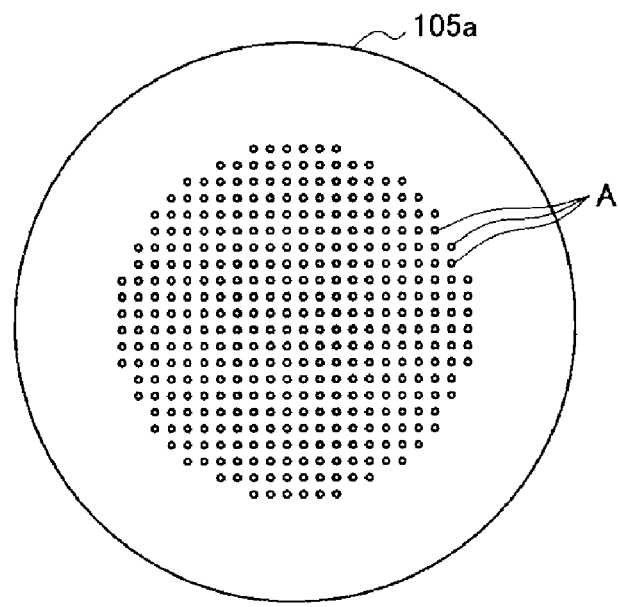
FIGS. 3A and 3B provide transversal cross sectional views (i.e. cross sectional views taken along a line 1-1 of FIG. 2B) of a base of an electrode in accordance with the embodiment.
Figure 3B:
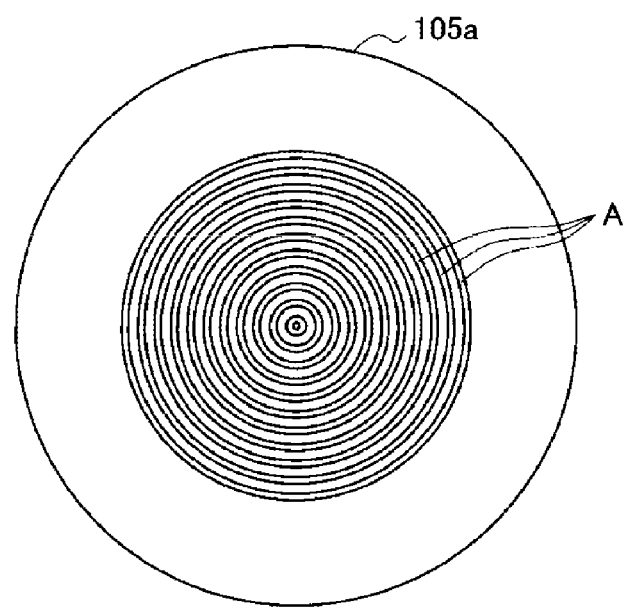

FIGS. 3A and 3B are transversal cross sectional views (i.e. a cross sectional view taken along a line 1-1 of FIG. 2B) of the upper base 105a of the upper electrode 105 in accordance with the present embodiment. The fine holes may be uniformly provided at the central area of the upper base 105a. A function and an effect of the fine holes A will be described later.

A pattern of the fine holes may be, but not limited to, a substantially square and may be any pattern having uniformity within the surface, such as a substantially equilateral triangular or a substantially circular. Instead of the fine holes A, one or more ring-shaped grooves may be formed concentrically.

Returning to FIG. 1, a varying mechanism 200 as a moving body is installed at an upper side of the ceiling of the RIE plasma etching apparatus 10. In the varying mechanism 200, a multiple number of rod-shaped members B configured to be inserted/separated to/from the multiple number of fine holes A may be fixed to a base plate 205.

The base plate 205 may be connected with a motor M serving as a driving mechanism. By driving the varying mechanism 200 by a power of the motor M, the multiple number of rod-shaped members B may be moved up and down, and, thus, the multiple number of rod-shaped members B may be controlled to be inserted/separated to/from the multiple number of fine holes A.

The lower electrode 110 may include a lower base 110a made of metal such as aluminum and the lower base 110a is supported by a supporting table 110c via an insulating layer 110b. Thus, the lower electrode 110 may be in an electrically floating state. A lower portion of the supporting table 110c may be covered with a cover 110d. A baffle plate 120 may be installed at a lower outer periphery of the lower electrode 110 so as to control a flow of a gas.

A coolant reservoir 110a1 may be provided in the lower electrode 110, so that a coolant is introduced through a coolant inlet pipe 110a2 in a direction as indicated by an arrow IN and circulated in the coolant reservoir 110a1, and then discharged through the coolant inlet pipe 110a2 in a direction as indicated by an arrow OUT. Thus, the lower electrode 110 may be controlled to have a predetermined temperature.

In an electrostatic chuck 125 on the lower electrode 110, a metal sheet member (electrode member) 125b may be embedded in an insulating member 125a. The electrode member 125b may be connected with a DC power supply 135, and DC voltage output from the DC power supply 135 may be applied to the electrode member 125b, so that the wafer W may be electrostatically attracted to the lower electrode 110. A focus ring 130 made of, for example, silicon may be installed at an outer periphery of the electrostatic chuck 125 in order to maintain uniformity of plasma.

The lower electrode 110 may be connected with a first matching unit 145 and a first high frequency power supply 150 via a first power supply rod 140. The gas within the processing chamber 100 may be excited into plasma by electric field energy of a high frequency power for plasma excitation output from the first high frequency power supply 150. By the electric discharge plasma generated in this way, an etching process may be performed on the wafer W. In the present embodiment, although the upper electrode 105 is referred to as a first electrode and the lower electrode 110 is referred to as a second electrode, the first electrode may be any one of the upper electrode 105 and the lower electrode 110 and the second electrode may be any one of the upper electrode 105 and the lower electrode 110.

The lower electrode 110 may be connected with a second matching unit 160 and a second high frequency power supply 165 via a second power supply rod 155 branched from the first power supply rod 140. A high frequency power of, for example, about 3.2 MHz output from the second high frequency power supply 165 may be used as bias voltage to attract ions toward the lower electrode 110.

An exhaust port 170 may be provided at a bottom surface of the processing chamber 100, and the inside of the processing chamber 100 may be maintained in a predetermined vacuum state by driving an exhaust device 175 connected with the exhaust port 170.

Multi-pole ring magnets 180a and 180b may be arranged around the upper chamber 100a. The multi-pole ring magnets 180a and 180b may be provided such that a multiple number of columnar anisotropic segment magnets may be installed in a ring-shaped magnetic casing and magnetic poles of the adjacent columnar anisotropic segment magnets are alternately reversed. Thus, magnetic force lines may be formed between the adjacent segment magnets and a magnetic field may be formed only at a peripheral area of a processing space between the upper electrode 105 and the lower electrode 110, so that plasma may be confined in the processing space.

Figure 2A:
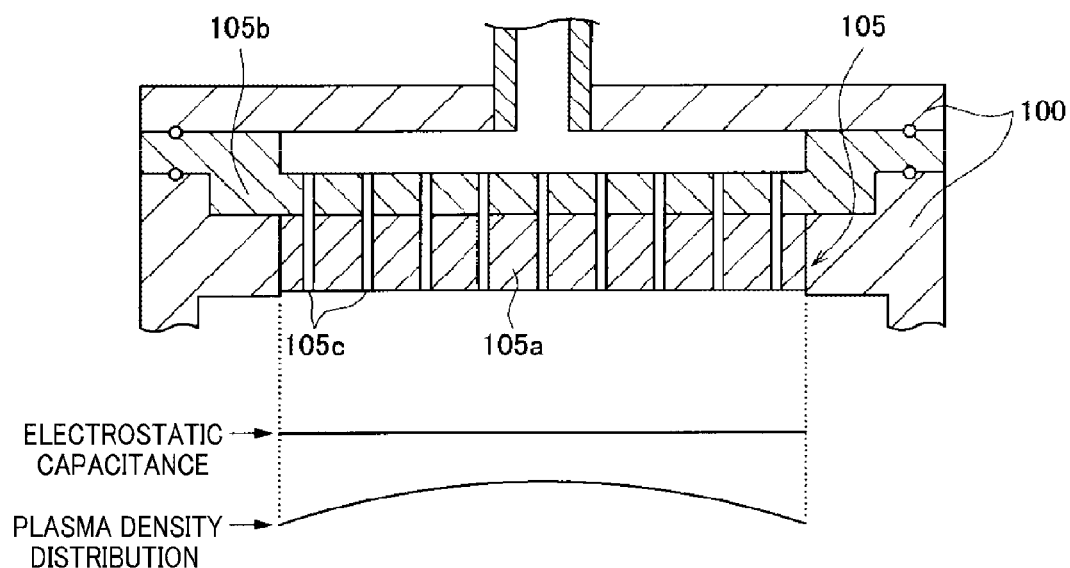
FIG. 2A is a longitudinal cross sectional view of a conventional upper electrode and FIG. 2B is a longitudinal cross sectional view of an upper electrode in accordance with the embodiment of the present disclosure.

Hereinafter, a structure of an electrode installed in the RIE plasma etching apparatus 10 in accordance with the present embodiment will be explained in detail. FIG. 2A is a longitudinal cross sectional view of a typical upper electrode, and FIG. 2B is a longitudinal cross sectional view of the above-described upper electrode 105 in accordance with the present embodiment.

(Fine Hole of Upper Electrode and Control of High Frequency Electric Field Intensity)

Figure 10:
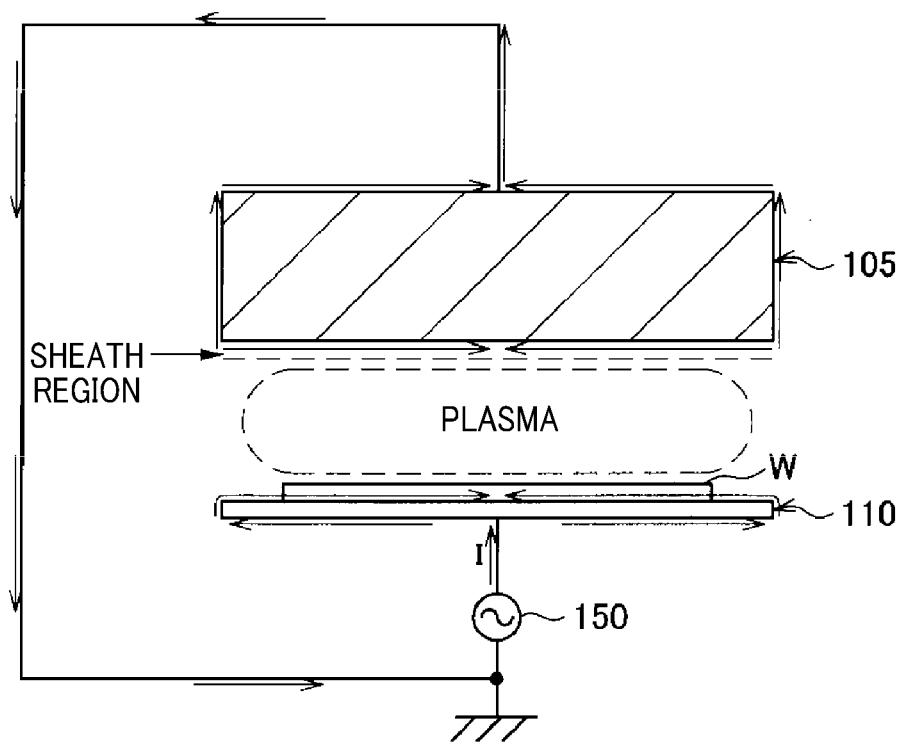
FIG. 10 is a diagram for explaining high frequency current applied to a conventional plasma apparatus.

As depicted in FIG. 10, as a frequency of the power supplied from the high frequency power supply 150 becomes higher, a high frequency current flows along a surface of the lower electrode 110 and particularly, along a top surface of the lower electrode 110 from an edge area toward a central area by a skin effect. Accordingly, electric field intensity at the central area of the lower electrode 110 becomes higher than electric field intensity at the edge area of the lower electrode 110, so that ionization or dissociation of a gas is accelerated at the central area of the lower electrode 110. Consequently, electron density of plasma at the central area of the lower electrode 110 becomes higher than electron density of plasma at the edge area thereof. Accordingly, resistivity of plasma may become low at the central area of the lower electrode 110 as compared to the edge area thereof, and, thus, the high frequency current is concentrated at the central area of the upper electrode 105 and plasma density becomes more non-uniform. FIG. 2A shows a state in which a distribution of plasma density is high at a central area of a plasma generation space and is low at an edge area thereof. Further, a distribution of capacitance (electrostatic capacitance) may be uniform since the upper base 105a made of a dielectric material may be flat.

On the contrary, in the upper electrode 105 in accordance with the present embodiment depicted in FIG. 2B, a multiple number of fine holes A may be formed on a top surface of the upper base 105a as described above. The multiple number of fine holes A may communicate with the processing chamber 100. That is, generally, a gap may be formed between the upper base 105a and the base plate 105b during a machining process. For this reason, an inner space of the processing chamber 100 may communicate with an inner space of each of the fine holes A. Therefore, if the inside of the processing chamber 100 is exhausted to be in a vacuum state by the exhaust device 175 in order to perform a plasma process, the inside of the fine hole A may also be in a vacuum state through the gap. Therefore, the vacuum space within the fine hole A may be regarded as a dielectric layer having a dielectric constant $\in_0$ of about "1."

Figure 4A:
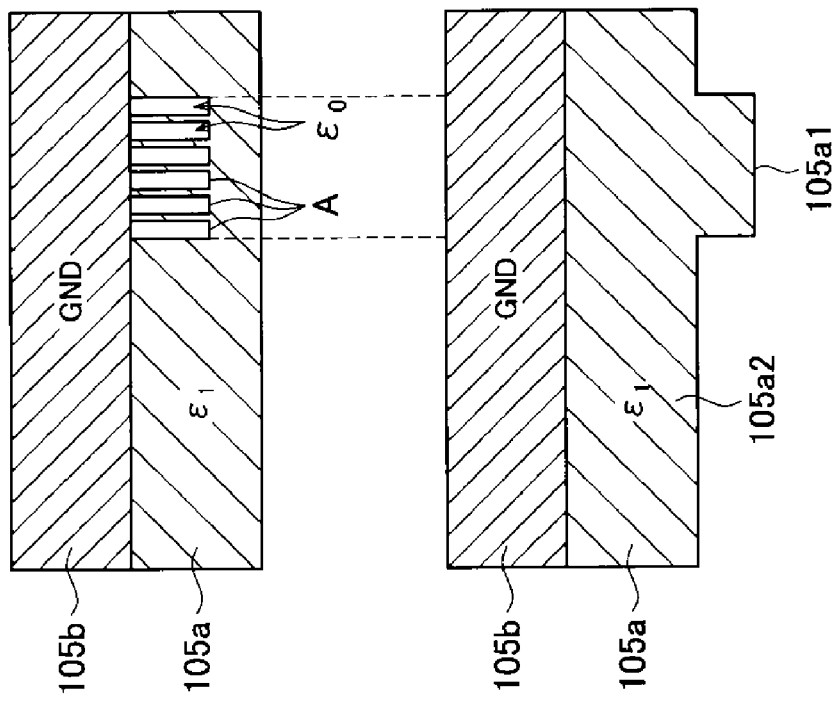
FIG. 4A is a diagram for explaining a function of a fine hole formed in an electrode in accordance with the embodiment and FIG. 4B is a diagram for explaining a function of a metal rod installed in the electrode in accordance with the embodiment.

As described above, the upper base 105a is made of quartz having a dielectric constant $\in_1$ of about "3.8". Therefore, there may be made a difference in a dielectric constant between the upper base 105a and the fine hole A. Here, the dielectric constant $\in_0$ of the vacuum space is the lowest among dielectric materials. Therefore, the dielectric $\in_0$ within the fine hole A is surely lower than the dielectric constant $\in_1$ of the upper base 105a. Accordingly, a capacitance within the fine hole A is surely lower than a capacitance of the upper base 105a. In terms of an electrostatic capacitance, an area where fine holes A are formed as depicted in an upper part of FIG. 4A has an effect equal to a case in which a dielectric member serving as the upper base 105a becomes thick as depicted in a lower part of FIG. 4A as a protruding portion 105a1. That is, if fine holes A having a vacuum state therein are formed in the upper base 105a, it is possible to obtain an effect equal to a case in which a capacitance of the protruding portion 105a1 of the upper base 105a depicted in the lower part of FIG. 4A is connected with a capacitance of a flat portion 105a2 thereof in parallel.

Based on this principle, in the present embodiment, by forming the multiple number of fine holes A at the central area of the upper base 105a, an electrostatic capacitance at the central area of the upper base 105a may be reduced to be lower than an electrostatic capacitance at a periphery thereof. Accordingly, it is possible to achieve an effect equal to a case in which the dielectric member serving as the upper base 105a becomes thicker at the central area than the periphery thereof, that is, an effect of making it difficult for a high frequency to easily escape from the central area of the upper base 105a than from the periphery thereof. Consequently, in the present embodiment, plasma density at the central area of the upper base 105a can be reduced, so that a density distribution of plasma can be uniform.

In the present embodiment, depths of the fine holes A may be varied such that the multiple number of fine holes A may not penetrate the upper base 105a from the top to the bottom on the side of the plasma generation space. To be specific, the depth of the fine holes A at the peripheral area may be shallower than the depth of the fine holes A at the central area. Accordingly, the multiple number of fine holes A may be formed to have a taper shape when viewed as a whole. Here, the top surface of the upper base 105a serves as a bottom surface of the taper shape. Accordingly, as depicted in FIG. 2B, a distribution of electrostatic capacitance at the central area within the upper base 105a can be gradually changed so as to be lower than a distribution of electrostatic capacitance at the periphery thereof, so that a distribution of plasma density can be further uniform.

A depth of each fine hole A is not limited to the example of the present embodiment. Desirably, a depth of each fine hole A may be adjusted such that the fine hole A at a high plasma density area may be formed to have a great depth and the fine hole at a low plasma density may be formed to have a shallow depth.

A multiple number of rod-shaped members B is formed to have depths corresponding to the depths of the fine holes A, respectively. In the present embodiment, a depth of the fine hole A formed at the periphery (outer side) of the upper base 105a is shallower than a depth of the recess formed at the central area (inner side) of the upper base 105a. Accordingly, according to the depths of the fine holes A, a length of a rod-shaped member B formed at an outer side of the upper base 105a is shorter than a length of a rod-shaped member B formed at an inner side of the upper base 105a.

The fine hole A may not penetrate the upper base 105a from the top to the bottom on the side of the plasma generation space and may be physically isolated from the plasma generation space. Accordingly, it may be possible to prevent ions in the plasma from being introduced into the fine hole A, and, thus, it may be possible to avoid a generation of abnormal electric discharge within the fine hole A.

The fine hole A may be a micro hole having a diameter equal to or less than twice a thickness of a sheath. Herein, "width of a plasma sheath (s)" may be represented by the following equation 1.

$$s = \frac{4}{3}\left(\frac{z \cdot \varepsilon_0^2}{e \cdot kTe}\right)^{\frac{1}{4}} \cdot \frac{V^{\frac{3}{4}}}{n_i^{\frac{1}{2}}}$$

ρ: Width of sheath in case of a DC sheath
$\varepsilon_0$: Dielectric constant in a vacuum state
R: Boltzmann constant
$T_e$: Electron temperature
V: Sheath potential
$n_i$: Ion density Generally, unless a special machining process is performed, a gas passing through the gas passages 105d and the gas inlet lines 105e is introduced into the fine hole A. Therefore, if the inner space of the fine hole A is not filled with a sheath, the gas within the fine hole A may be excited by energy of a high frequency power and an abnormal electric discharge may be generated within the fine hole A. However, in the present embodiment, the diameter of the fine hole A is set to be equal to or less than twice the thickness of the sheath.

Therefore, the inner space of the fine hole A may become a sheath region. Consequently, it may be possible to avoid a generation of abnormal electric discharge within the fine hole A and possible to prevent plasma from being introduced into the fine hole A.

The diameter of the fine hole A may be varied within a range of twice the thickness of the sheath. By way of example, the fine holes A formed at the peripheral area of the upper base 105a may have a diameter smaller than the diameter of the fine holes A formed at the central area of the upper base 105a. Even if the fine holes A have the same depth, it may be possible to obtain an effect of the taper-shaped fine holes A depicted in FIG. 2B by changing the diameters of the fine holes A. Therefore, a distribution of plasma density can be uniform. Alternatively, both the depths of the fine holes A and the diameters of the fine holes A may be adjusted.

The multiple number of rod-shaped members B are formed to have thicknesses corresponding to the depths of the multiple number of fine holes A, respectively. Accordingly, in the present embodiment, the diameters of the rod-shaped members B formed at the periphery of the upper base 105a may be smaller than the diameters of the rod-shaped members B formed at the central area of the upper base 105a according to the diameters of the fine holes A.

Further, the multiple number of recesses formed in the dielectric base may not be limited to the multiple number of fine holes A formed in the upper base 105a. By way of example, the recesses may be concentric ring-shaped grooves as shown in FIG. 3B. Furthermore, the multiple number of protruding members of the varying mechanism 200 may not be limited to the rod-shaped members. By way of example, the protruding members may be ring-shaped plate members capable of being inserted into and separated from the concentric ring-shaped members shown in FIG. 3B.

(Varying Mechanism of Dielectric Rods: Dielectric Constant $\in_1$ of Base=Dielectric Constant $\in_2$ of Dielectric Member)

Now, an operation and an effect of inserting and separating dielectric rods $B_1$ as the rod-shaped members B of the varying mechanism 200 will be discussed with reference to FIG. 5. Here, the dielectric rods $B_1$ and the upper base 105a are made of the same dielectric member. By way of example, if the upper base 105a is made of quartz, the dielectric rods $B_1$ may also be made of quartz, and, thus, the dielectric constant $\in_1$ of the upper base 105a and the dielectric constant $\in_2$ of the dielectric rods $B_1$ may be equal to about 3.8.

Figure 5:
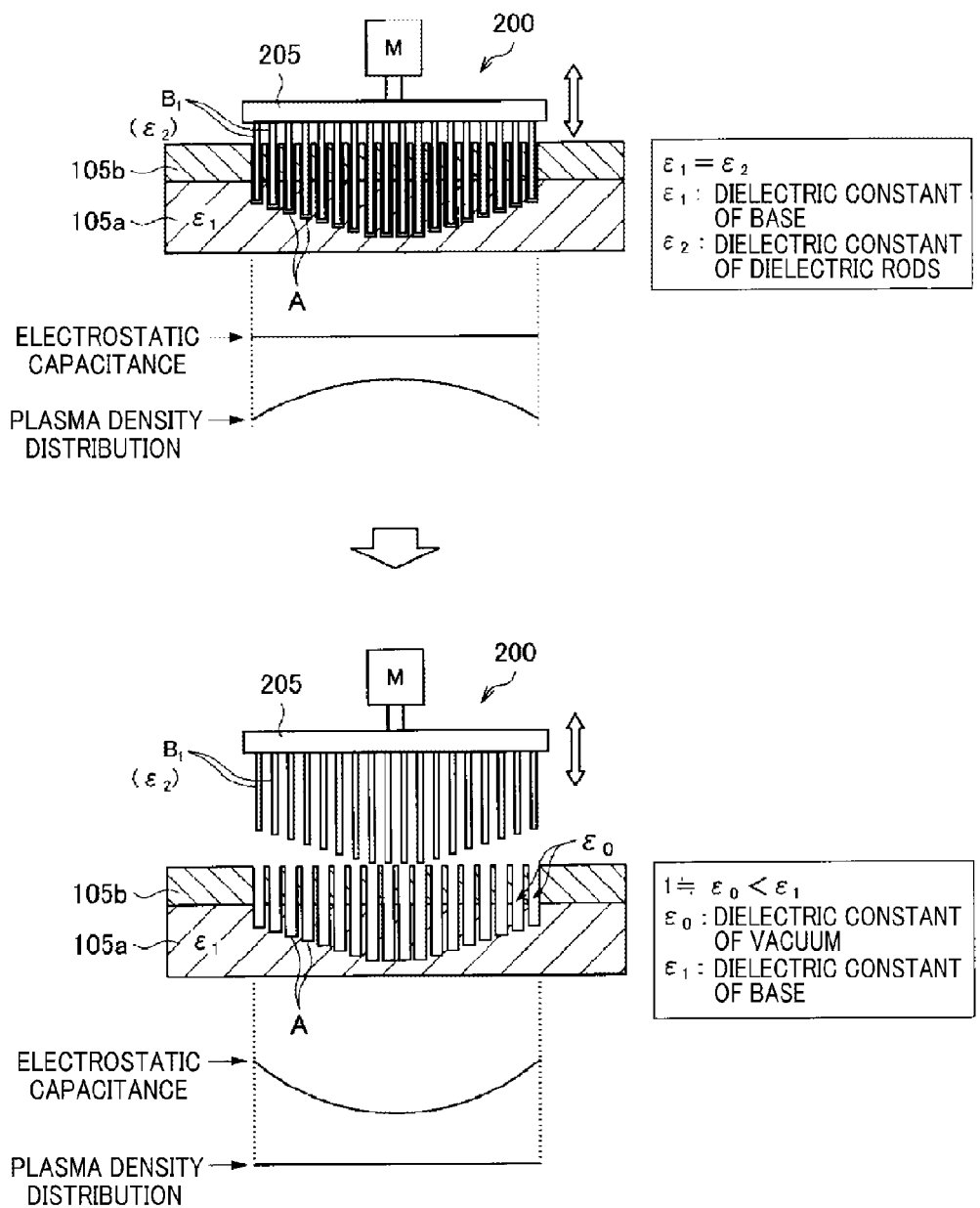
FIG. 5 is a diagram for explaining an effect when a varying mechanism of dielectric rods is inserted/separated to/from fine holes in accordance with the embodiment.

An upper diagram of FIG. 5 illustrates a state in which the varying mechanism 200 is placed at a lowermost position and the dielectric rods $B_1$ are inserted in the fine holes A to its bottom such that the insides of the fine holes A are filled with the dielectric rods $B_1$. This state is regarded as being substantially the same as a state in which no fine holes A are formed in the upper base 105a, as depicted in a second diagram from the left of FIG. 6 indicating a "case of same dielectric members". Accordingly, when the varying mechanism 200 is located at the lowermost position, electrostatic capacitance may be uniformly distributed under the upper base 105a, but an uniformization effect by the upper electrode may not be obtained.

Subsequently, if the varying mechanism 200 is raised as illustrated in a lower diagram of FIG. 5, the insides of the fine holes A from which the dielectric rods $B_1$ are separated may be turned into vacuum spaces. As discussed above, since the inside of the processing chamber 100 is maintained in a vacuum state during a process, the inside of each fine hole A may also be turned into a vacuum state. At this time, the inside of the fine hole A may be considered as a vacuum rod. A dielectric constant $\in_0$ of the vacuum space is about 1 and is lower than the dielectric constant $\in_1$ of the upper base 105a. Based on the principle as discussed above, in terms of an electrostatic capacitance, an area where fine holes A are formed has an effect equal to a case in which a dielectric member serving as the upper base 105a becomes thick. As a result, as depicted in a lower part of FIG. 6 indicating a "case of vacuum", an electrostatic capacitance at the central area of the upper base 105a may be set to be lower than an electrostatic capacitance at the periphery thereof. Accordingly, it is possible to achieve an effect equal to a case in which the dielectric member serving as the upper base 105a becomes thicker at the central area than the periphery thereof. That is, it may be difficult for a high frequency to easily escape from the central area of the upper base 105a than from the periphery thereof. As a consequence, a plasma density at the central area of the base 105a can be reduced, and a plasma density distribution may be uniformed. Further, by forming the fine holes A in a taper shape when viewed as a whole, an electric field intensity in the fine holes A at the periphery of the upper base 105a can be controlled not to be excessively decreased, so that more uniform plasma may be generated.

(Varying Mechanism of Metal Rods)

Now, an operation and an effect of inserting and separating metal rods $B_2$ as the rod-shaped members B of the varying mechanism 200 will be discussed with reference to FIG. 7. An upper diagram of FIG. 7 illustrates a state in which the varying mechanism 200 is placed at a lowermost position and the metal rods $B_2$ are inserted in the fine holes A to its bottom such that the insides of the fine holes A are filled with the metal rods $B_2$. This state is regarded as same as a state in which the metal base plate 105b has a protrusion of a taper shape at the center of the upper base 105a, as depicted in a leftmost diagram of FIG. 6 indicating a "case of metal."

Figure 4B:
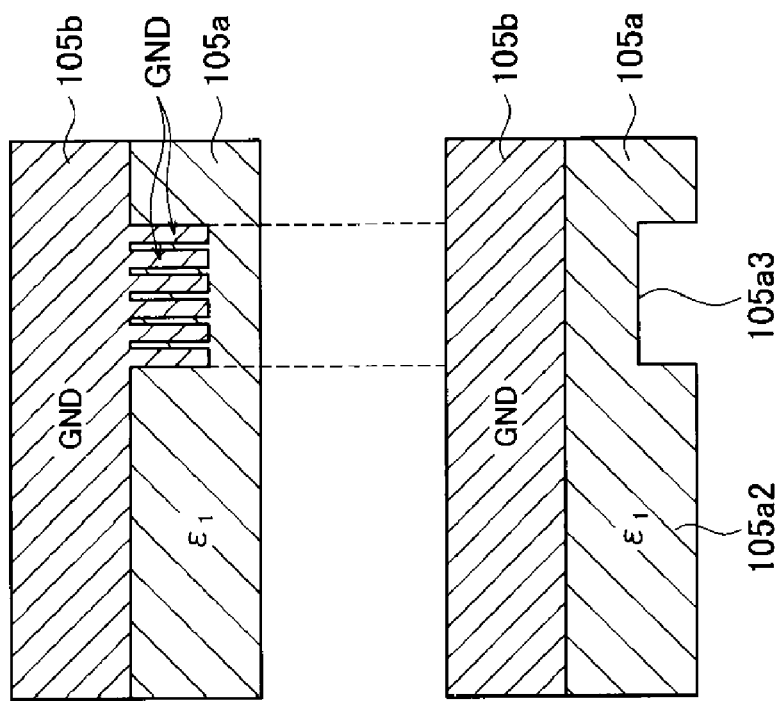

In terms of electrostatic capacitance, by way of example, an area where fine holes A as recesses are formed as depicted in the upper part of FIG. 4B has an effect equal to a case in which a dielectric member serving as the base becomes thin as depicted as a depressed portion 105a3 in the lower part of FIG. 4B. Accordingly, when the varying mechanism 200 is located at the lowermost position, an electrostatic capacitance at the central area of the upper base 105a can be set to be higher than an electrostatic capacitance at the periphery thereof, as shown in the leftmost diagram of FIG. 6. Accordingly, a high frequency power may be allowed to escape from the central area of the upper base 105a more easily than from the periphery thereof.

As illustrated in a middle diagram of FIG. 7, if the varying mechanism 200 is raised about half-way, the insides of the fine holes A from which the meal rods $B_2$ are absent may become vacuum spaces. In terms of electrostatic capacitance, the vacuum space of each fine hole A may have the same effect as depicted in FIG. 4A, i.e., the same effect as in case that the dielectric member of the upper base 105a becomes thicker. Accordingly, as depicted in the diagram on the lower side of FIG. 6, the electrostatic capacitance at the central area of the upper base 105a can be set to be lower than the electrostatic capacitance at the periphery thereof. Thus, it is possible to achieve an effect equal to a case in which the dielectric member serving as the upper base 105a becomes thicker at the central area than the periphery thereof. That is, it may be difficult for a high frequency power to easily escape from the center of the upper base 105a than from the periphery thereof.

Moreover, as illustrated in a lower diagram of FIG. 7, if the varying mechanism 200 is further raised and the metal rods $B_2$ are completely separated from the fine holes A, the whole inside of each fine hole A may become a vacuum space. Accordingly, the electrostatic capacitance at the central area of the upper base 105a can be set to be lower than the electrostatic capacitance at the periphery thereof. Thus, it may become more difficult for a high frequency power to easily escape from the central area of the upper base 10a than from the periphery thereof.

As discussed above, if the rod-shaped members B of the varying mechanism 200 are formed of the dielectric members $B_1$ or the metal members $B_2$, and a position of this varying mechanism 200 is controlled, and the degree of filling the fine holes A with the rod-shaped members B is adjusted, the uniformization effect by the upper electrode can be made variable. Thus, plasma density distribution can be more uniformed depending on processing conditions.

(Varying Mechanism of Dielectric Rods: Dielectric Constant $\in_1$ of Base<Dielectric Constant $\in_2$ of Dielectric Member)

Figure 6:
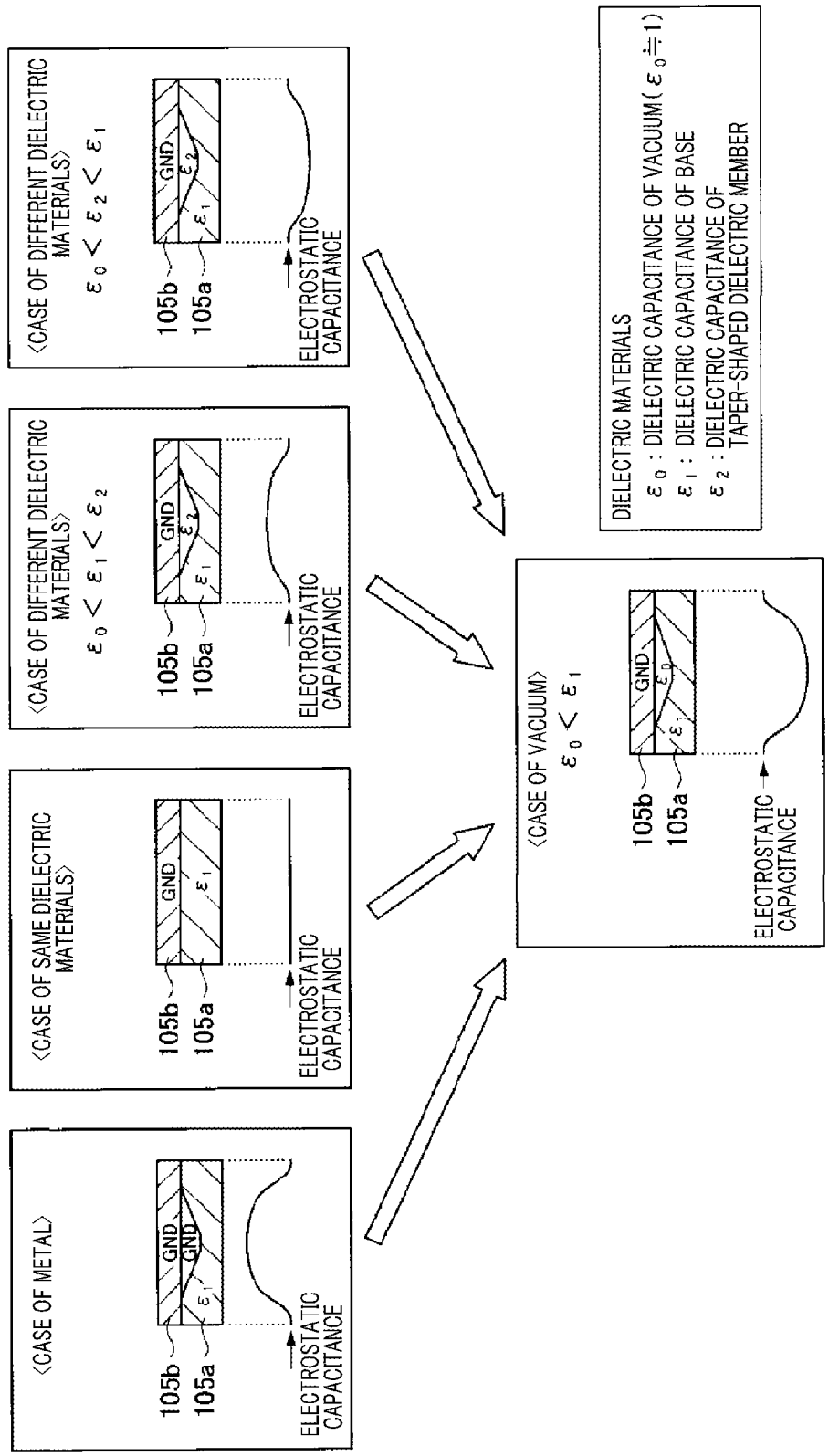
FIG. 6 is a diagram for explaining a materials relationship between a rod-shaped member of the varying mechanism and the base and an effect in terms of an electrostatic capacitance.
Figure 7:
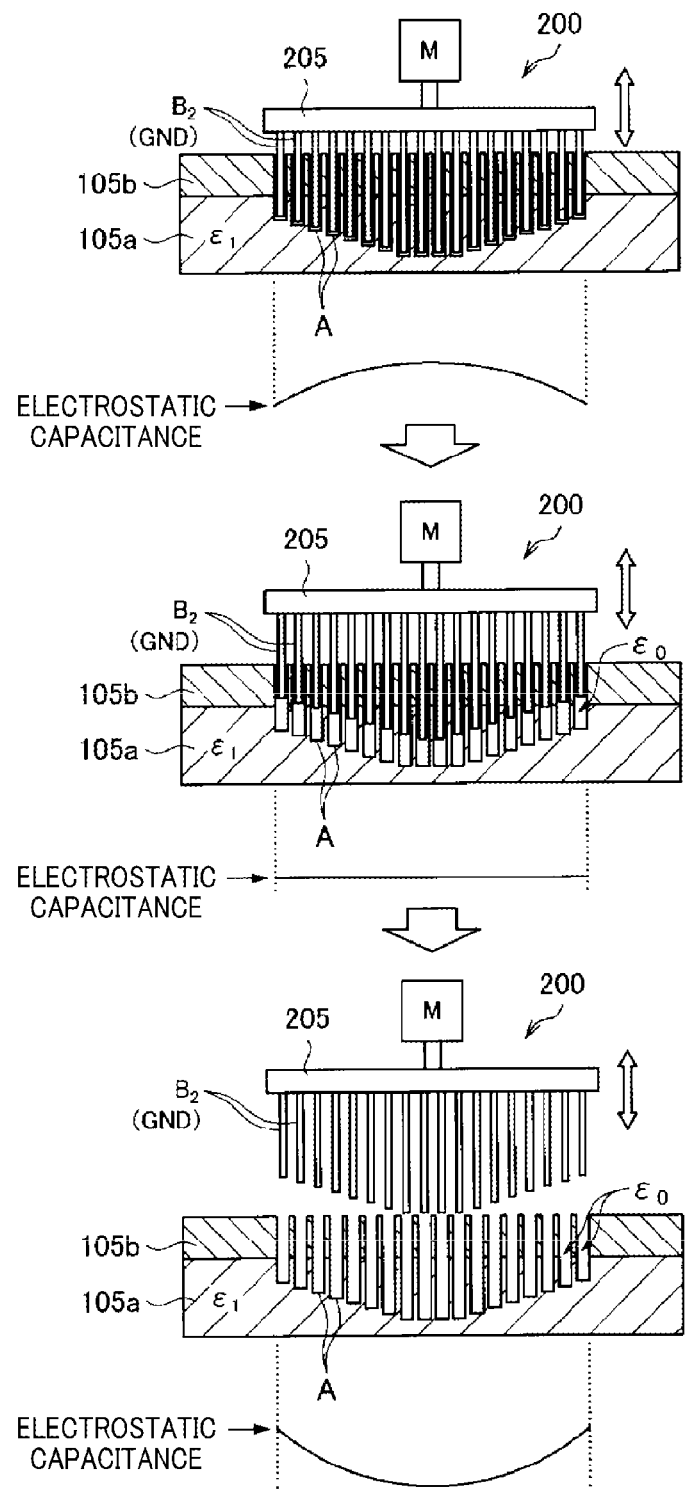
FIG. 7 is a diagram for explaining an effect when the varying mechanism of metal rods is inserted/separated to/from the fine holes in accordance with the embodiment.

Further, in two diagrams on the right side of FIG. 6 each indicating a "case of different dielectric members," there is illustrated a uniformization effect by the upper electrode in case that the upper base 105a and the taper-shaped dielectric member are made of different dielectric materials. A second diagram from the right of FIG. 6 shows an uniformization effect by the upper electrode when the dielectric constant $\in_1$ of the upper base 105a is lower than the dielectric constant $\in_2$ of the taper-shaped dielectric member. In this case, the electrostatic capacitance at the central area of the upper base 105a can be set to be higher than the electrostatic capacitance at the periphery thereof. Accordingly, a high frequency power may be allowed to escape more easily from the center of the upper electrode 105a than from the periphery thereof.

(Varying Mechanism of Dielectric Rods: Dielectric Constant $\in_1$ of Base>Dielectric Constant $\in_2$ of Dielectric Member)

In a rightmost diagram of FIG. 6, there is described an uniformization effect by the upper electrode when the dielectric constant $\in_1$ of the upper base 105 is higher than the dielectric constant $\in_2$ of the taper-shaped dielectric member. In this case, the electrostatic capacitance at the central area of the upper base 105a may be set to be lower than the electrostatic capacitance at the periphery thereof. Accordingly, a high frequency power may not be allowed to easily escape from the center of the upper base 105a. However, as compared to the case of providing the vacuum space regarded as a vacuum rod, the effect of suppressing the escape of the high frequency power may be decreased.

In accordance with the above-described uniformization effect by the upper electrode, in case that the multiple number of protruding members are manufactured by using the dielectric rods $B_1$, it may be desirable that the dielectric constant $\in_1$ of the upper base 105a is set to be higher than the dielectric constant $\in_2$ of the dielectric rods $B_1$ if a plasma density is higher at the central area.

Further, in consideration of the differences in the uniformization effects by the upper electrode described above, if the plasma density is higher at the central area, the dielectric rods $B_1$ satisfying the relationship of $\in_1<\in_2$ between the dielectric constant $\in_1$ of the upper base 105a and the dielectric constant $\in_2$ of the dielectric rods $B_1$ may be located outside the varying mechanism 200, desirably. Meanwhile, desirably, the dielectric rods $B_1$ satisfying the relationship of $\in_1>\in_2$ between the dielectric constant $\in_1$ of the upper base 105a and the dielectric constant $\in_2$ of the dielectric rods $B_1$ may be located inside the varying mechanism 200.

In case of using the metal rods $B_2$, the uniformization effect by the upper electrode may be high as discussed above. However, when the metal rods $B_2$ are used, a leading end of each metal rod $B_2$ may be rounded so as not to have a pointed shape, to thereby avoid an abnormal electric discharge.

Moreover, since a difference between the dielectric constant $\in_2$ of the dielectric rod $B_1$ and the dielectric constant $\in_0$ of the vacuum space increases as the dielectric rod $B_1$ is made of a material having a higher dielectric constant $\in_2$, the uniformization effect by the upper electrode may be enhanced by inserting the dielectric rod into the fine hole. That is, as the dielectric rod $B_2$ is made of a material having a higher dielectric constant $\in_2$, a more similar effect to an effect of using a metal rod may be achieved.

The kinds of the multiple number of rod-shaped members B fixed to the varying mechanism 200 may be different. By way of example, metal rods $B_2$ may be fixed to the outer side of the upper base 105a; dielectric rods $B_1$ of a dielectric constant $£_2$ having a relationship of $\in_1 < \in_2$ may be fixed to an intermediate area between the inner side and the outer side of the upper base 105a; and dielectric rods $B_1$ of a dielectric constant $\in_3$ having a relationship of $\in_1 > \in_3$ may be fixed to the inner side of the upper base 105a. This configuration is nothing more than an example, and other combinations may be possible depending on a plasma density distribution.

(Driving of Multi-Parts)

The varying mechanism 200 may be configured as multi-parts, and the respective parts may be moved individually. To elaborate, the rod-shaped members B installed so as to correspond to the fine holes A may be divided into two or more parts and the respective parts may be moved individually. By way of example, the rod-shaped members B may be divided into two parts: one including rod-shaped members B located at an inner side of the upper base 105a and the other including rod-shaped members B located at an outer side of the upper base 105a.

An example driving method for the multi-parts is illustrated in FIG. 8. Here, the varying mechanism 200 includes a base plate 205a and a base plate 205b separated from each other so as to individually drive rod-shaped members Ba located at an outer side of fine holes A of the upper base 105a and rod-shaped members Bb located at an inner side of fine holes A of the upper base 105a. The rod-shaped members Ba at the outer side is driven by a motor Ma, while the rod-shaped members Bb at the inner side is driven by a motor Mb. With this configuration, insertion/separation of the rod-shaped members Ba into/from the fines holes Aa at the outer side and insertion/separation of the rod-shaped members into/from the fine holes Ab at the inner side can be performed individually. Accordingly, plasma uniformity can be further improved depending on a process.

Moreover, different kinds of rod-shaped members B may be used for the respective parts. By way of example, among the multiple number of rod-shaped members B, the rod-shaped members Ba inserted into and separated from the fine holes Aa at the outer side of the upper base 105a may be made of at least one of a metal member and a member having a higher dielectric constant than that of the rod-shaped members Bb inserted into and separated from the fine holes Ab formed at the inner side of the upper base 105b.

As described above, in accordance with the RIE plasma etching apparatus 10 having the upper electrode 105 of the present embodiment, there is provided a plasma processing apparatus capable of variably controlling an electric field intensity distribution of a high frequency power by using the electrode structure made of a homogeneous material and the varying mechanism 200.

(Specific Driving Method)

A specific driving method for the varying mechanism 200 will be explained with reference to FIGS. 9A and 9B.

Figure 9A:
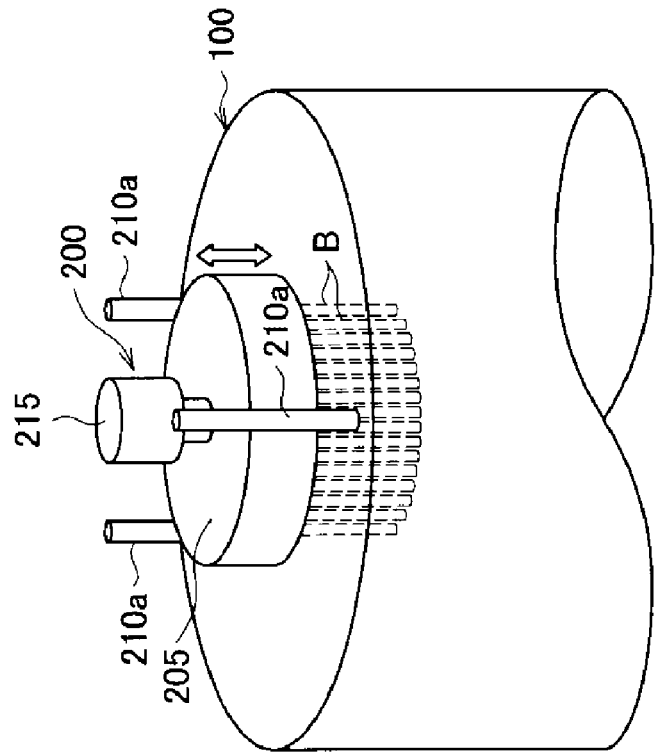
FIGS. 9A and 9B show examples of a driving mechanism configured to drive the varying mechanism.
Figure 9B:
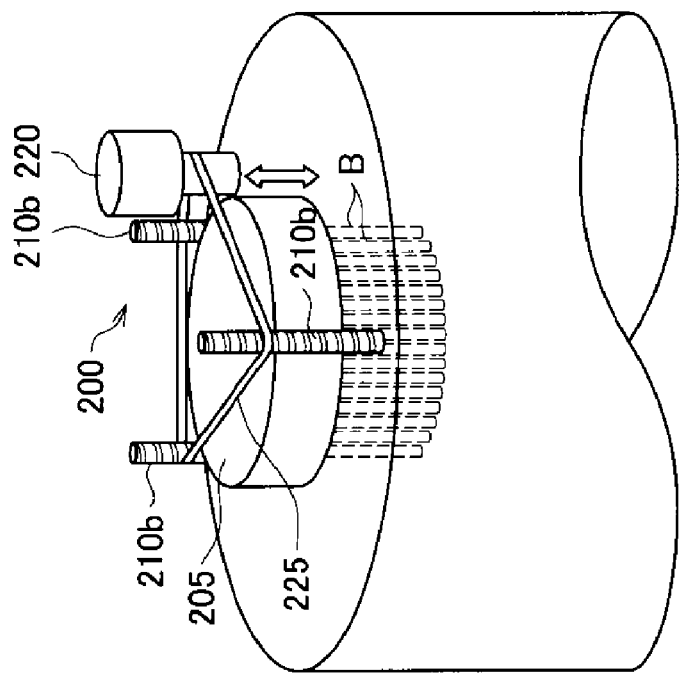

As a specific driving method for the varying mechanism 200, FIG. 9A shows a case of installing three or more equi-spaced straight-movement guide 210a, and FIG. 9B illustrates a case of installing three or more equi-spaced ball screw elevating mechanism 210b. Both cases can be applied to any of cases where the rod-shaped members B of the varying mechanism 200 are dielectric rods $B_1$ or metal rods $B_2$.

In FIG. 9A, the three or more equi-spaced straight-movement guide 210a are installed at the vicinity of the outer periphery of the base plate 205 on a ceiling of the processing chamber 100. The base plate 205 is connected with an air cylinder 215. If a driving force is delivered to the straight-movement guide 210a by the entrance/discharge of compressed air into the air cylinder 215, the base plate 205 is moved up and down and the rod-shaped members B are inserted into or separated from the fine holes A provided in the upper electrode 105. Generally, when the air cylinder 215 is used, the varying mechanism 200 may be moved between only two positions: an uppermost position and a lowermost position. However, under preset conditions, control of more than two positions may also be possible. Moreover, the straight-movement guide 210a and the air cylinder 215 are example driving mechanisms. The straight-movement guide 210a may be implemented by a general device such as a linear shaft or a LM guide.

As another example of the driving mechanism 215 of FIG. 9A, a combination of an electronic solenoid actuator and a straight-movement guide 210a may be used. In such a case, the electronic solenoid actuator may be used instead of the air cylinder 215. When the electronic solenoid actuator is used, the varying mechanism 200 can be moved between multiple positions including the uppermost position and the lowermost position. Since the driving operation in case of using the electronic solenoid actuator is the same as that in case of using the air cylinder, redundant description thereof will be omitted here.

In FIG. 9B, the three or more equi-spaced ball screw elevating mechanisms 210 are installed in the vicinity of the outer periphery of the base plate 205 on the ceiling of the processing chamber 100. Each ball screw elevating mechanism 210b is provided with a spiral groove in the form of a screw. In such a case, a driving force of a motor (e.g., a servo stepping motor) 220 may be delivered to the ball screw elevating mechanisms 210b via a driving belt 225, so that the base plate 205 is moved up and down by non-illustrated ball screws. With this configuration, continuously variable control of the varying mechanism 200 is enabled. Further, a combination of the ball screw elevating mechanism 210b, the motor 220, the driving belt 225 and the non-illustrated ball screws is one example of the driving mechanism.

Although the driving method for the varying mechanism 200 has been described above, any general driving method such as a magnetic driving method or an electric driving method may be used. Further, in the above description, although the varying mechanism 200 has been described to be moved up and down, the varying mechanism 200 may be fixed while the upper electrode 105 may be moved up and down.

The various embodiments have been described with reference to the accompanying drawings, but the present disclosure is not limited thereto. It would be understood by those skilled in the art that all modifications and embodiments conceived from the meaning and scope of the claims and their equivalents are included in the scope of the present disclosure.

By way of example, in the above-described embodiment, the upper electrode is referred to as a first electrode and the lower electrode is referred to as a second electrode, but the present disclosure is not limited thereto. By way of example, the lower electrode can be referred to as a first electrode and the upper electrode can be referred to as a second electrode. In this case, the fine holes A can be formed in the lower electrode and can be formed on both the upper electrode and the lower electrode.

Further, in the above-described embodiment, the high frequency power for plasma excitation has been applied to the lower electrode, but the present disclosure is not limited thereto. By way of example, the high frequency power for plasma excitation can be applied to any one of the upper electrode and the lower electrode or to both the upper electrode and the lower electrode.

The plasma processing apparatus in accordance with the present disclosure is not limited to a parallel plate type plasma processing apparatus. The plasma apparatus in accordance with the present disclosure may be used for any one of an inductively coupled plasma processing apparatus, a microwave plasma processing apparatus and other plasma processing apparatuses in addition to a capacitively coupled (parallel plate type) plasma processing apparatus.

Further, in the above-described embodiment, the plasma processing apparatus has been limited to the plasma etching apparatus. However, the present disclosure is not limited thereto. By way of example, the present disclosure may be applied to a film forming apparatus or an ashing apparatus in which plasma is excited to perform a plasma process on a processing target object.

The processing target object may be a silicon wafer or a substrate.

What is claimed is:

1. A plasma processing apparatus for introducing a processing gas into an evacuable processing chamber and generating plasma by a high frequency power and performing a plasma process on a processing target object by the plasma, the apparatus comprising:
   a dielectric base having a plurality of recesses, the dielectric base being included in an upper electrode installed in the processing chamber and facing the processing target object;
   a moving body provided with a plurality of protruding members capable of being inserted into and separated from the plurality of recesses;
   a driving mechanism configured to drive the moving body to allow the plurality of protruding members to be inserted from above into and separated from the plurality of recesses; and
   a lower electrode into which the high frequency power is supplied, the lower electrode being installed to face the upper electrode,
   wherein the moving body is configured to move up and down with respect to an upper surface of the processing target object.

2. The plasma processing apparatus of claim 1, wherein the plurality of recesses are fine holes or grooves.

3. The plasma processing apparatus of claim 2, wherein the plurality of protruding members are rod-shaped members capable of being inserted into and separated from the fine holes or plate-shaped members capable of being inserted into and separated from the grooves.

4. The plasma processing apparatus of claim 3, wherein a diameter of the fine hole formed at an outer side of the base is smaller than a diameter of the fine hole formed at an inner side of the base, and
   diameters of the rod-shaped members formed at the outer side of the base are smaller than diameters of the rod-shaped members formed at the inner side of the base according to the diameters of the fine holes.

5. The plasma processing apparatus of claim 2, wherein the fine holes are formed to have various diameters within a range of twice the thickness of the sheath.

6. The plasma processing apparatus of claim 1, wherein the plurality of protruding members are made of a dielectric material or a metal.

7. The plasma processing apparatus of claim 6, wherein, if the plurality of protruding members are made of the dielectric material, a dielectric constant of the base is higher than a dielectric constant of the dielectric material of the protruding members.

8. The plasma processing apparatus of claim 1, wherein the plurality of protruding members installed so as to correspond to the plurality of recesses are divided into at least two parts, and a part of the protruding members located at an inner side of the base and the other part of the protruding members located at an outer side of the base are moved individually.

9. The plasma processing apparatus of claim 8, wherein among the plurality of protruding members, the protruding members configured to be inserted into and separated from the recesses formed at an outer side of the base are made of at least one of a metal and a dielectric material having a dielectric constant higher than a dielectric constant of the protruding members configured to be inserted into and separated from the recesses formed at the inner side of the base.

10. The plasma processing apparatus of claim 1, wherein the plurality of recesses communicate with the processing chamber, and the inside of each recess is turned into a vacuum state if the inside of the processing chamber is turned into a vacuum state.

11. The plasma processing apparatus of claim 1, wherein the plurality of recesses are formed to have different depths such that the plurality of recesses do not penetrate the base from the top to the bottom on the side of a plasma generation space, and
   the plurality of protruding members are formed to have lengths corresponding to the depths of the recesses, respectively.

12. The plasma processing apparatus of claim 11, wherein depths of the recesses formed at an outer side of the base are shallower than depths of the recesses formed at an inner side of the base, and
   the lengths of the protruding members formed at the outer side of the base are shorter than the lengths of the protruding members formed at the inner side of the base according to the depths of the plurality of recesses.

13. The plasma processing apparatus of claim 11, wherein the plurality of recesses are formed in a taper shape when viewed as a whole.

14. A plasma processing apparatus comprising:
   a processing chamber for performing therein a plasma process on a processing target object;
   first and second electrodes arranged to face each other in the processing chamber and configured to form a processing space therebetween;
   a high frequency power supply connected with at least one of the first and second electrodes and configured to output a high frequency power into the processing chamber;
   a dielectric base included in the first electrode and having a plurality of recesses, the dielectric base facing the processing target object;
   a moving body disposed above the processing target object and including a plurality of protruding members capable of being inserted into and separated from the plurality of recesses; and a driving mechanism configured to drive the moving body to allow the plurality of protruding members to be inserted from above into and separated from the plurality of recesses, wherein the moving body is configured to move up and down with respect to an upper surface of the processing target object.

15. The plasma processing apparatus of claim 14, wherein the first electrode is an upper electrode, and the upper electrode is provided with a multiple number of gas inlet lines and serves as a shower head.

16. The plasma processing apparatus of claim 15, wherein the second electrode is a lower electrode, and the high frequency power supply supplies a high frequency power to the lower electrode.

\* \* \* \* \*

UNITED STATES PATENT AND TRADEMARK OFFICE
CERTIFICATE OF CORRECTION

PATENT NO. : 8,968,513 B2  Page 1 of 1
APPLICATION NO. : 13/046925
DATED : March 3, 2015
INVENTOR(S) : Daisuke Hayashi It is certified that error appears in the above-identified patent and that said Letters Patent is hereby corrected as shown below:

In the Specification

Column 13, line 16, please replace "$£_2$" with -- $\in_2$ --

Signed and Sealed this
Twenty-first Day of July, 2015

Michelle K. Lee
*Director of the United States Patent and Trademark Office*